(12) United States Patent
Visscher

(10) Patent No.: US 7,091,497 B2
(45) Date of Patent: Aug. 15, 2006

(54) PARTICLE-OPTICAL DEVICE FOR IRRADIATING AN OBJECT

(75) Inventor: Albert Visscher, Veldhoven (NL)

(73) Assignee: FEI Company, Hillsboro, OR (US)

( * ) Notice: Subject to any disclaimer, the term of this patent is extended or adjusted under 35 U.S.C. 154(b) by 206 days.

(21) Appl. No.: 10/795,759

(22) Filed: Mar. 8, 2004

(65) Prior Publication Data

US 2004/0178354 A1   Sep. 16, 2004

(30) Foreign Application Priority Data

Mar. 10, 2003   (NL)   ................................. 1022886

(51) Int. Cl.
*G21K 5/10*   (2006.01)
(52) U.S. Cl. ............................. 250/442.11; 250/440.11
(58) Field of Classification Search ...................... None
See application file for complete search history.

(56) References Cited

U.S. PATENT DOCUMENTS

| | | | | |
|---|---|---|---|---|
| 4,585,969 A | * | 4/1986 | Tanaka | 310/328 |
| 4,928,030 A | * | 5/1990 | Culp | 310/328 |
| 5,237,236 A | * | 8/1993 | Culp | 310/317 |
| 5,465,021 A | * | 11/1995 | Visscher et al. | 310/328 |
| 5,939,816 A | * | 8/1999 | Culp | 310/328 |
| 6,154,000 A | * | 11/2000 | Rastegar et al. | 318/632 |
| 6,504,669 B1 | * | 1/2003 | Janz et al. | 360/78.05 |
| 6,522,388 B1 | | 2/2003 | Takahashi et al. | |
| 6,768,124 B1 | | 7/2004 | Suzuki et al. | |
| 6,791,664 B1 | | 9/2004 | Auer et al. | |

* cited by examiner

*Primary Examiner*—Nikita Wells
*Assistant Examiner*—Anthony Quash
(74) *Attorney, Agent, or Firm*—Hilgers, Bell & Richards LLP; Michael O. Scheinberg; Patrick Stellitano

(57) ABSTRACT

The invention provides a particle-optical device for irradiating an object with a beam of particles. The device comprises a housing in which are located positioning means 1 for positioning the object within the housing. The positioning means comprise a reference body 2 supported against a supporting portion of the housing and a kinematic system—which can be manipulated—with an object carrier 9 for manipulating the object held in the object carrier in at least one degree of freedom with respect to the reference body 2, the device further comprising control means and at least one combination 23,30 of a piezo-electric position actuator 25 and a piezo-electric force sensor 35, which actuator and sensor are positioned in series, whereby the control means—in dependence upon at least one input signal from at least one sensor—generates a control signal for at least that actuator associated with said sensor, characterized in that the series-positioned actuators and sensors of said at least one combination are positioned between the housing and the reference body, the support of the reference body against the supporting portion of the housing occurring via said at least one combination.

26 Claims, 6 Drawing Sheets

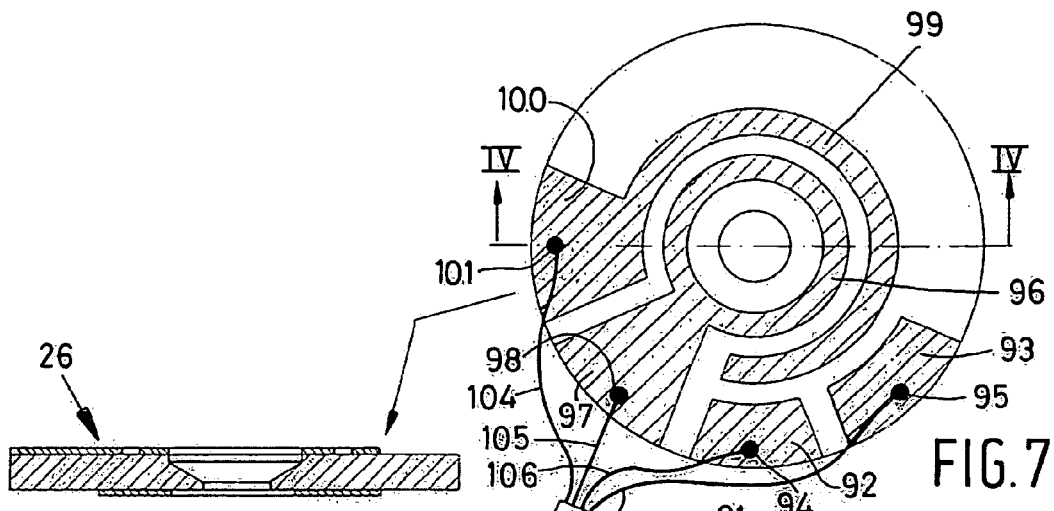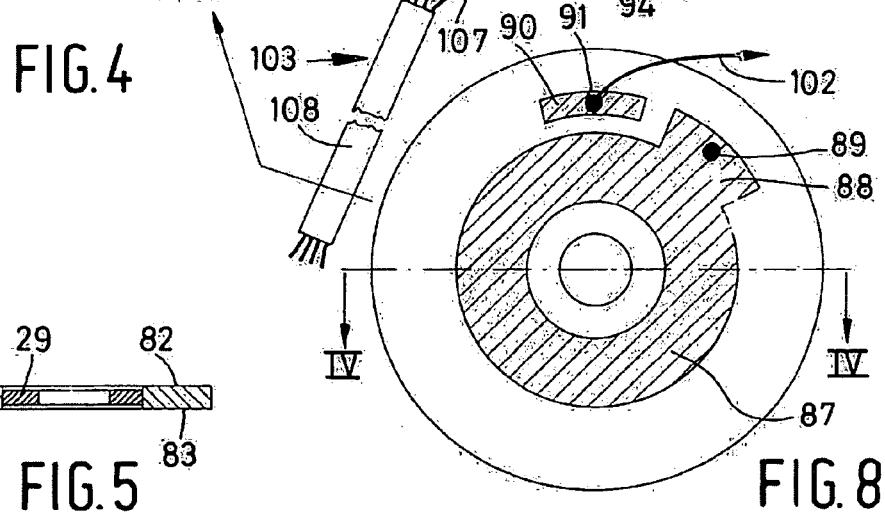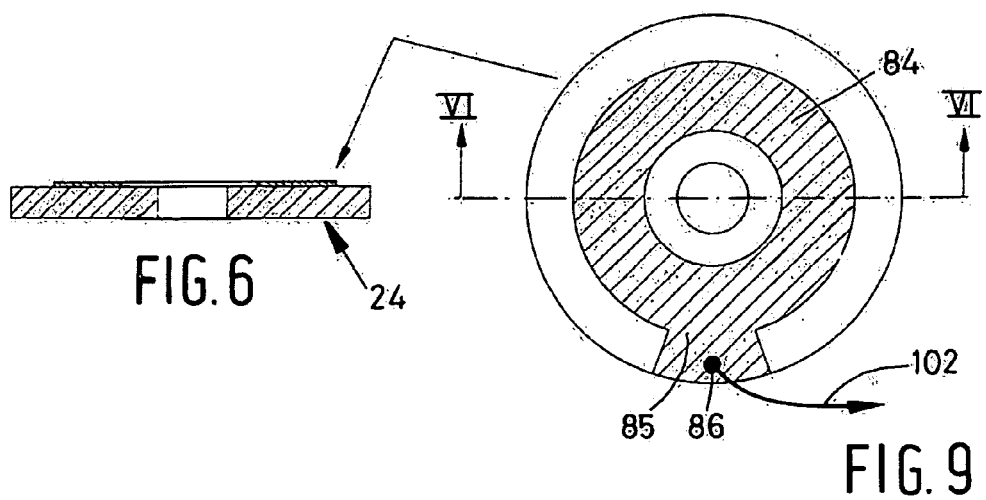

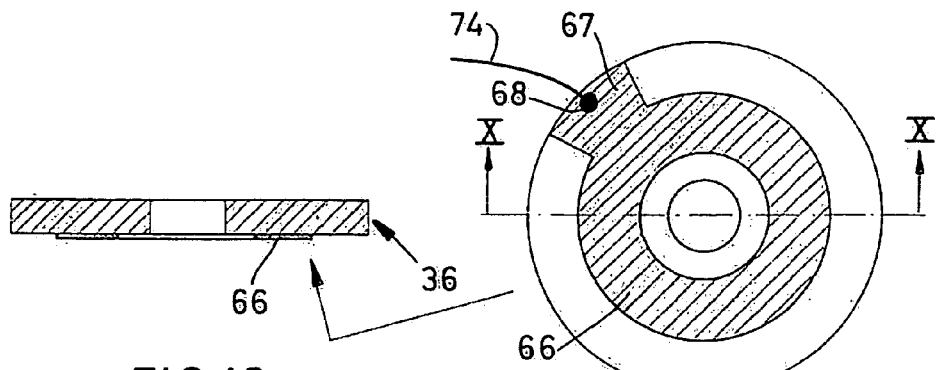
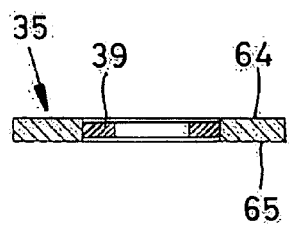
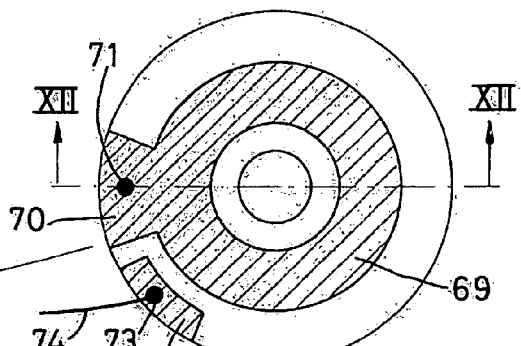
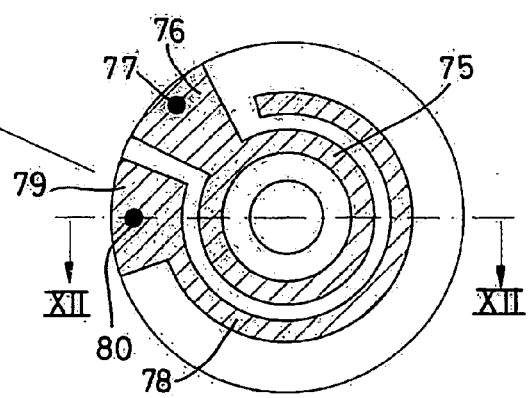
FIG.10
FIG.11
FIG.12
FIG.13
FIG.14
FIG.15

PARTICLE-OPTICAL DEVICE FOR IRRADIATING AN OBJECT

FIELD OF THE INVENTION

The invention relates to a particle-optical device for irradiating an object with a beam of particles, comprising a housing in which are located positioning means for positioning the object within the housing, comprising a reference body supported against a supporting portion of the housing and a kinematic system—which can be manipulated—with an object carrier for manipulating the object held in the object carrier in at least one degree of freedom with respect to the reference body, the device further comprising control means and at least one combination of a piezo-electric position actuator and a piezo-electric force sensor, which actuator and sensor are positioned in series, whereby the control means—in dependence upon at least one input signal from at least one sensor—generates a control signal for at least that actuator associated with said sensor.

BACKGROUND OF THE INVENTION

A combination of a piezo-electric position actuator and a piezo-electric force sensor, which actuator and sensor are positioned in series, is known from the technical literature, and is often referred to using the term. "Smart Disc". In every Smart Disc, there is a control system that receives an output signal from the force sensor—in the form of a voltage signal—as an input signal for the control system and, in reaction hereto, generates a control signal for the attendant actuator. The operation of the actuator can thus be aimed at opposing the force observed by the sensor, e.g. as caused by accelerative forces associated with small vibrations, which phenomenon can be usefully exploited in opposing small vibrations. The relationship existing between the control signal generated by the control unit and the input signal received by the control unit is also referred to using the term "controller transfer", with a certain frequency-dependent characteristic and a certain amplification factor (also referred to using the term "gain").

A particle-optical device according to the opening paragraph is known from European patent application EP 1225482 A1. Said document describes a lithographic device that uses a beam of UV, electrons or ions to process a wafer for integrated semiconductor circuits. To this end, use is made of an optical system with a lens for generating and focusing a beam of particles onto a desired position on a wafer. The optics—or more specifically their lens—are supported on a horizontal main plate via three lens supports. Each of the lens supports comprises a pair of Smart Discs. The main plate can be regarded as being connected to the fixed world via air springs and dampers with a typical eigenfrequency of the order of 1 Hz. Underneath the lens is located a wafer that is supported by a wafer table, which can manipulate the wafer in the horizontal plane and also in the vertical direction, with the purpose of following vibrations in the main plate caused by the resilience of said air springs and dampers. To this end, one or more interferometers are provided, comprising part of a control circuit that ensures that the vertical distance between the main plate and the wafer remains constant, so as to achieve a correct focus.

The lens typically has a first eigenfrequency located in the range 50–150 Hz. Resonance of the lens can therefore arise as a result of environmental acoustic noise or floor vibrations, e.g. generated by apparatus surrounding the device. Such vibrations can ultimately lead to a situation whereby the accuracy of the (horizontal) positioning of the beam of particles and/or the focusing of the beam of particles on the wafer is no longer adequate. By employing the Smart Discs (of which there is a total of six, corresponding to the six degrees of freedom of the lens), the vibrations resulting from this resonance are actively damped, as a result of which an improved accuracy of the focusing of the beam of particles on the wafer can be realized.

SUMMARY OF THE INVENTION

The invention aims now to provide a particle-optical device whereby resonances that influence the mutual positioning of the beam of particles and the object to be irradiated, and whose eigenfrequencies are located in a range between 75 Hz and 1000 Hz, are damped. More specific reference is hereby made in the first instance to an electron microscope, particularly a scanning electron microscope, whereby the positioning means typically have a different construction than the positioning means pertaining to a device according to EP 1225482 A1, as a result of which these positioning means will also exhibit a substantially different, more complex and dominant vibrational behavior. In this context, one should realize that samples in electron microscopes not only have to be capable of being manipulated (by the positioning means) in the plane perpendicular to the beam, but also in a direction parallel to this beam, to an extent that is significantly greater than the extent to which wafers in the device according to EP 1225482 A1 are to be manipulated in a direction parallel to the beam. In addition, the positioning means in electron microscopes are required to be suitable to tilt samples through a substantial tilt range of, for example, 60 degrees, to which end the positioning means are provided with suitable guiding means. As a result of this, the intrinsic stiffnesses of the positioning means in the case of electron microscopes are often markedly lower than the stiffnesses that can be achieved in the case of devices according to EP 1225482 A1. Moreover, it is a general fact that the stability demands made of the positioning means of an electron microscope are greater than comparable demands in the case of devices according to EP 1225482 A1.

Although the invention is particularly suitable for application in electron microscopes, it is not limited hereto, and can also be applied in the case of other types of particle-optical devices, e.g. of the type described in EP 1225482 A1.

In further preferential embodiments of the invention, the invention aims inter alia to optimally exploit the possibilities offered by Smart Discs for the purpose of damping vibrations, and to allow the incorporation of Smart Discs in a simple manner and at low manufacturing costs.

To this end, the particle-optical device according to the invention is characterized in the first instance in that the series-positioned actuator and sensor of said at least one combination is positioned between the housing and the reference body, the support of the reference body against the supporting portion of the housing occurring via said at least one combination. The invention recognizes in this manner that, for certain types of particle-optical devices, the determining factor as regards the accuracy of positioning and of focusing of the beam on the object is not such much determined by the resonance behavior of the optics as by the resonance behavior of the positioning means, and that a very advantageous damping of such resonance vibrations can be achieved thanks to the characterizing measures according to the invention. In general, preferably at least three combinations of series-positioned actuators and sensors are provided in the case of a device according to the invention. Thanks to the invention, an improved stability can also be achieved.

So as to be confronted as little as possible by the finite stiffness of the construction of series-positioned actuators and sensors itself—as a result of which, under the influence of external forces, the positioning means can be brought into unfavorable resonance at relatively low frequencies, as a result of which inaccuracies and reduced stability as regards the positioning and focusing can occur—at least three combinations are preferably positioned close to a circumferential edge of the reference body.

In this context, it is also preferable that at least three combinations be positioned close to three corner points of the reference body.

As a result of the fact that, normally, image disturbing resonances of the positioning means will occur in two perpendicular directions, it is preferable that two connecting lines between the positions of at least three combinations intersect each other at right angles.

According to a highly advantageous preferential embodiment of the invention, a support element is positioned between the housing and the reference body, via which support element—supplementary to the support via said at least one combination—the support of the reference body against the supporting portion of the housing additionally occurs, whereby the sum of the number of support elements and the number of combinations is at least four. As will be made clear hereafter, such an embodiment can also be applied to great advantage if the series-positioned actuators and sensors of said at least one combination and said at least one support element are not positioned between the housing and the reference body, but generally between other bodies between which active damping is intended to occur via Smart Discs, such as between the main plate and the lens as in the case of the device according to EP 1225482 A1. The great advantage of supporting the reference body against the supporting portion of the housing at four positions instead of three positions lies in the fact that, in this fashion, the stiffness behavior of the reference body will be markedly more advantageous, as a result of which an increase of the eigenfrequency (which is to be suppressed/damped) of the positioning means will occur, and deformations of the reference body will be less disadvantageous, certainly if said at least four positions of support are located in four corner points (to the extent present) of the reference body.

As a result of the application of four support positions, an over-determined scenario arises whereby it should be prevented that the support in fact occurs at only three support positions. Accordingly, during assembly of the device according to the invention, one should ensure that the four supporting portions, of which at least one is in the form of a combination of a piezo-electric actuator and a sensor and at least one is in the form of a support element, are accurately positioned perpendicular to the plane of the reference body so that four support positions are actually active. To this end, it is preferable that at least one of the support positions be adjustable in height.

Preferably, said at least one support element comprises at least one further combination of a piezo-electric position actuator and a piezo-electric force sensor, which actuator and sensor are positioned in series, which at least one further combination is supplemental to said at least one combination, whereby the sum of the number of combinations and the number of further combinations is at least four. In this manner, one obtains great freedom as regards the manner in which resonance vibrations can be damped by the further combination—also by making use of an active element in this set-up.

Another effect arising from the over-determined scenario attendant to the application of four support positions is based on the fact that, as soon as a single actuator is activated, a certain disturbing parallel stiffness tends to arise as a result of deformation of the reference body. In activating one actuator, forces shall now be observed at all sensors, which forces are unintentionally associated with the reaction forces arising as a result of this torsional deformation of the reference body and not—as is desired—with the force to be detected by the sensors as a result of accelerative forces of the vibrations (that are to be damped) of the positioning means. This behavior, which is caused by parallel stiffness across said at least one combination of the series-positioned actuator and sensor, is also referred to using the technical term "crosstalk from actuator to sensor". In the event of too great an amount of such (mechanical) crosstalk from actuator to sensor, the risk exists that it will be impossible from the point of view of control theory to continue to effectively damp vibrations with the aid of Smart Discs. To mitigate mechanical crosstalk, the control means preferably comprise first combining means for the purpose of combining at least a first input signal and a second input signal—from, respectively, at least a first sensor and a second sensor—into a first combined input signal, in dependence upon which the control means generate a first mutual control signal for the respective actuators associated with at least both the first sensor and the second sensor. Because, in this manner, input signals from a given sensor are not only of influence on the activity of the associated actuator, but also on that of the actuator associated with another sensor, one is able to achieve a scenario whereby the plane defined by the four support points remains more or less in correspondence with the plane of the reference body, as a result of which mechanical crosstalk diminishes and the reference body no longer deforms, or at least deforms to a markedly reduced extent. This advantageous effect can even be achieved if the first sensor and the second sensor are formed by a mutual sensor that, on the basis of an observed force, generates a mutual input signal for the control means, which signal is subsequently converted by the control means into the first mutual control signal.

A similar effect, but acting in a different direction, can be obtained if the control means comprise second combining means for the purpose of combining at least the second input signal and a third input signal, from at least the second sensor and a third sensor, respectively, into a second combined input signal, in dependence upon which the control means generate a second mutual control signal for the respective actuators associated with at least the second sensor and the third sensor, whereby the control means comprise third combining means for the purpose of combining the first mutual control signal and the second mutual control signal into a combined mutual control signal for the second actuator. As a result of such a set-up, the activity of the second actuator will depend upon the input signals originating from the first, second and third sensor—in other words upon the forces exerted upon these sensors. Disturbing, undesired parallel stiffness arising from deformations of the reference body can thus also be prevented in the case of a second movement potential corresponding to a second degree of freedom of the reference body in a second direction. In this case also, however, one should once again note that, within the bounds of the invention, it is also possible to make use of a single mutual sensor instead of two sensors.

A higher sensitivity of the employed actuators and sensors, leading to a more favorable signal-to-noise ratio, is obtained if the first combining means are embodied to combine at least the first input signal, the second input signal, a third input signal and a fourth input signal—from, respectively, at least the first sensor, the second sensor, a third sensor and a fourth sensor—into the first combined input signal, in dependence upon which the control means generate the first mutual control signal for the actuators respectively associated with the first sensor, the second sensor, the third sensor and the fourth sensor.

A similarly advantageous effect is obtained in a second direction if the second combining means are embodied to combine at least the first input signal, the second input signal, the third input signal and the fourth input signal—from, respectively, at least the first sensor, the second sensor, the third sensor and the fourth sensor—into the second combined input signal, in a manner differing from the manner in which the first combining means combine the first input signal, the second input signal, the third input signal and the fourth input signal into the first combined input signal, in dependence upon which second combined input signal the control means generate the second mutual control signal for the actuators respectively associated with the first sensor, the second sensor, the third sensor and the fourth sensor.

In general, it is noted that, where reference is made above to control signals, these control signals do not have to serve directly as input signals for the relevant actuators, but can also be further processed in a suitable manner, for example by combination (addition and/or subtraction, whether weighted or not) with other control signals, so as to arrive at an actual input signal for the actuators concerned.

According to a very advantageous preferential embodiment of the invention, an intermediate body is provided between, on the one hand, the series-positioned actuator and sensor of said at least one combination, and, on the other hand, the reference body. In such a case, the series-positioned actuator and sensor of said at least one combination are provided between, on the one hand, the housing (or, more specifically, the support element thereof, and, on the other hand, the intermediate body. This markedly simplifies the assembly of the various parts of the device according to the invention, as a result of the fact that, in the first instance, the series-positioned actuator and sensor of said at least one combination can be correctly mounted before, in a later step, mounting the positioning means, which are usually characterized by great weight. Moreover, the intermediate body can form protection for delicate parts of said at least one combination. These advantages are also obtained if the intermediate body is applied between two (random) bodies, between which at least one combination of a piezo-electric sensor and actuator are applied.

Both from the point of view of simplicity and of relatively small (bending) stiffness, the intermediate body is preferably plate-like, so that introduction of the intermediate body will not cause any undesired parallel stiffness.

A highly suitable plate-like intermediate body is one that is made of aluminum and has a thickness smaller than 10% of the smallest principal dimension of the plate-like intermediate body. The term "principal dimension" should be construed in the case of rectangular plates as referring to the length and the breadth (whereby the breadth is naturally smaller than the length), or, in the case of, for example, a disc-like intermediate body, as referring to a diameter thereof, whereby it is assumed that the disc-like form is not necessarily round.

For the purpose of fixing the series-positioned actuator and sensor of said at least one combination with respect to one another, it is advantageous if the intermediate body, parallel to said at least one combination, is connected to the housing before positioning said at least one combination between the intermediate body and the housing.

If the intermediate body, parallel to said at least one combination, is connected to the housing before positioning of said at least one combination between the intermediate body and the housing, one obtains the possibility of still being able to displace the reference body with respect to the intermediate body, which is necessary in installing the device according to the invention so as to ensure that, in use, the object positioned by the positioning means, of which the reference body is part, is situated at the focus of the beam of particles. In the case of certain types of positioning means, one refers in this context to the eucentric axis of the positioning means, which is thus required to extend through the focus of the beam of particles.

In order to adjust the relative positioning of, on the one hand, the reference body (and, accordingly, the positioning means), and, on the other hand, the housing, the device according to the invention is preferably provided with adjusting means, via which the reference body can be displaced in a direction parallel to the plate-like intermediate body.

These adjusting means are preferably embodied so as to allow the reference body to be displaced in three degrees of freedom.

A very suitable value of the force with which the reference body is supported against the intermediate body—which, moreover, allows the desired small displacement of the intermediate body with respect to the reference body—lies in the range between twice and twenty times the total weight of the positioning means that are to be supported.

For the generation of such a force, spring means are preferably provided for the purpose of forcing the reference body and the intermediate body toward one another.

Such spring means once again bring the attendant risk (already referred to earlier) of introducing undesired parallel stiffness across said at least one combination of the series-positioned actuator and sensor. Therefore, the stiffness of the employed spring means must be sufficiently low, whereby the following rule of thumb for the relationship between two eigenfrequencies preferably pertains:

$$f_{spring} < \tfrac{1}{3} * f_{pos}$$

wherein fpos is the eigenfrequency (units: Hz) of the positioning means that, with the aid of the invention, it is sought to suppress, and fspring is the eigenfrequency of the imaginary system that would arise if the combined mass of the reference body plus the positioning means were to be supported on the spring means alone, i.e. in the absence of any combination or support element. This quantity fspring is accordingly simply dependent upon said stiffness (whose magnitude is to be curtailed) of the spring means, according to the relationship:

$$f_{spring} = \tfrac{1}{2\pi} * \sqrt{(c/m)}$$

whereby "c" is the stiffness of the spring means and "m" is the combined mass of the positioning means (including the reference body).

According to a further particular preferential embodiment, each actuator is clamped between, respectively, a first actuator conducting body, in conducting contact with a first actuator pole of the actuator, and a second actuator conducting body, in conducting contact with a second actuator pole of the actuator, which first actuator conducting body and which second actuator conducting body are in conducting contact with the control means. The application of such actuator conducting bodies, between which the actuator is clamped, further simplifies the incorporation of said at least one combination in the device according to the invention during the manufacture thereof, particularly when the number of applied combinations is greater than one.

A similar advantage is applicable if each sensor is clamped between, respectively, a first sensor conducting body, in conducting contact with a first sensor pole of the sensor, and a second sensor conducting body, in conducting contact with a second sensor pole of the sensor, which first sensor conducting body and which second sensor conducting body are in conducting contact with the control means.

In the context of a possible simplified connection scheme of the various poles of the sensors and actuators, it is of further advantage if one of the two conducting bodies associated with the actuator or the sensor of a combination is provided with two contact points that are in conducting contact with both poles of the associated actuator or sensor. In this manner, connection of the control means to the poles of the actuators or sensors can occur via one conducting body, whereby the other conducting body is conductively connected to said one conducting body.

So as to prevent, to the greatest extent possible, disturbing parallel stiffnesses from occurring across said at least one combination of actuator and sensor, it is preferable that the actuator with associated conducting bodies and/or the sensor with associated conducting bodies be provided with mutually connecting holes that collectively form a through-hole through which a traction organ extends for the purpose of clamping the actuator and/or the sensor, respectively, between the associated conducting bodies. The force with which the actuators and/or sensors are clamped between the associated conducting bodies should, in principle, be just sufficient to correctly position and hold the actuators, the sensors and the associated conducting bodies with respect to one another.

A further improvement in this context is obtained if one of the four conducting bodies associated with the actuator and the sensor of a combination is provided with four contact points that are in conducting contact with both poles of both the actuator and the sensor. In this manner, a single multi-core cable can be used to connect every combination of an actuator and sensor to the control means, for the purpose of, on the one hand, sending input signals—being the input signals for the control means—from the sensors, and, on the other hand, sending control signals from the control means, resulting in input signals for the actuators.

Also, with an eye to allowing the correct placement and connection of the combinations of actuators and sensors to proceed easily, it is preferable that the conducting bodies that are located between the actuator and the sensor of a combination be provided, at the sides facing one another, with contact points that are conductively connected to each other.

A very advantageous embodiment of such conducting bodies, and thus of the device according to the invention, is obtained if at least a portion of the conducting bodies is provided—on at least one external surface—with at least one isolated conducting track for direct electrical contact either with a pole of an actuator or of a sensor or with a contact point or conducting track of a conducting body. Such tracks can render defunct the use of electrically conducting wire connections between conductive bodies mutually or between the conducting bodies and a pole of an actuator or sensor.

According to a further preference, the conducting bodies associated with a combination of an actuator and a sensor are conductively connected to conducting organs that extend to outside the housing. Such conducting organs can, for example, be formed by electrically conducting cables. Because the conducting organs extend to outside the housing, the control means can also be provided outside the housing.

BRIEF DESCRIPTION OF THE DRAWINGS

The invention will be further elucidated on the basis of the description of a non-limiting preferential embodiment of the invention.

FIG. 4 shows, according to IV—IV in FIGS. 7 and 8, an upper printed circuit board.

FIG. 5 shows, in vertical transverse cross section, a piezo-electric sensor.

FIG. 6 shows, in transverse cross section according to VI—VI in FIG. 9, a lower printed circuit board.

FIG. 7 shows the printed circuit board according to FIG. 4 in a plan view.

FIG. 8 shows the printed circuit board according to FIG. 4 in an underneath view.

FIG. 9 shows the printed circuit board according to FIG. 6 in a plan view.

FIG. 10 shows, according to cross section X—X, an upper printed circuit board.

FIG. 11 shows, in vertical transverse cross section, a piezo-electric actuator.

FIG. 12 shows, according to cross section XII—XII in FIGS. 14 and 15, a lower printed circuit board.

FIG. 13 shows the printed circuit board according to FIG. 10 in an underneath view.

FIG. 14 shows the printed circuit board according to FIG. 12 in a plan view.

FIG. 15 shows the printed circuit board according to FIG. 12 in an underneath view.

DETAIL DESCRIPTION

Figure 1:
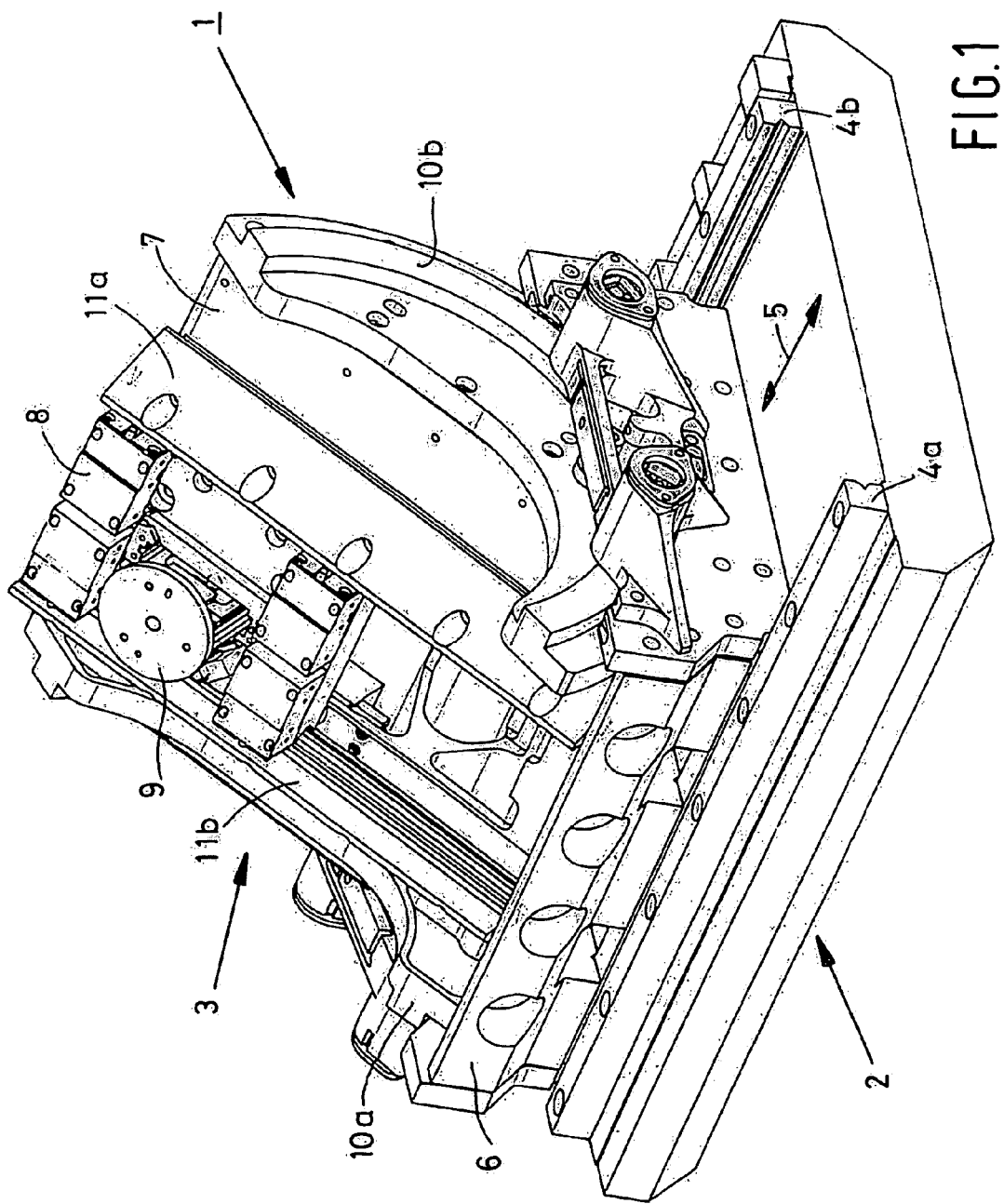
FIG. 1 shows, in perspective view, a manipulator for a sample in a scanning electron microscope.

FIG. 1 shows a manipulator 1 for application in the case of a scanning electron microscope. The manipulator 1 is made up of a base plate 2 and a manipulation unit 3. The base plate 2 has a length of approximately 300 mm and is connected to a portion of the housing of the scanning electron microscope in a manner that will be described later, particularly with reference to FIG. 2. The weight of the manipulator 1 is approximately 17 kg, whereby the weight of the separate manipulation unit 3 amounts to approximately 7 kg and the weight of the base plate 2 amounts to approximately 10 kg. The manipulation unit 3 can be displaced as a whole with respect to the base plate 2 along guides 4a, 4b in the direction of the double arrow 5 through a stroke of circa 150 mm. The manipulation unit 3 comprises a first displacement body 6, a swivel body 7, a second displacement body 8 and a sample holder 9. The first displacement body 6 is provided on opposite sides of the swivel body 7 with a bent guide, through which a portion of correspondingly formed, externally oriented guide ribs 10 of the swivel body 7 extend. Thanks to the co-operation between the guides (not further depicted) of the first displacement body 6 and the guide ribs 10a, 10b of the swivel body 7, it is possible to cause the swivel body 7, together with the second displacement body 8 and the sample holder 9, to swivel about the central axis of the bent/arch form of the relevant guides and guide ribs 10a, 10b, through an angular range of circa 60 degrees.

Perpendicular to said central axis, the swivel body 7 is provided with a pair of guide bodies 11a, 11b on opposite sides of the second displacement body 8, for guided co-operation with guide organs (not further depicted) of the second displacement body 8 that are directed toward the guide bodies 11a, 11b. In this manner, translation of the second displacement body 8 with the sample holder 9 is made possible in the longitudinal direction of the guide bodies 11a, 11b, through a stroke of circa 150 mm. The sample holder, which has a disc-like form, can be rotated through a number of complete revolutions about its own central axis, and can also be adjusted in height through circa 30 mm perpendicular to the plane of the disc-like form. The sample holder is suitable for holding samples which are destined for further study with the scanning electron microscope concerned.

Thanks to all guides as described above, it is possible to manipulate the sample in a total of five degrees of freedom, so as to optimally position and orient the sample in the focus of the electron ray that is generated in the scanning electron microscope. Manipulators of the type of manipulator 1 are known to the skilled artisan, and a detailed description thereof is not necessary in the context of the present invention.

Figure 2:
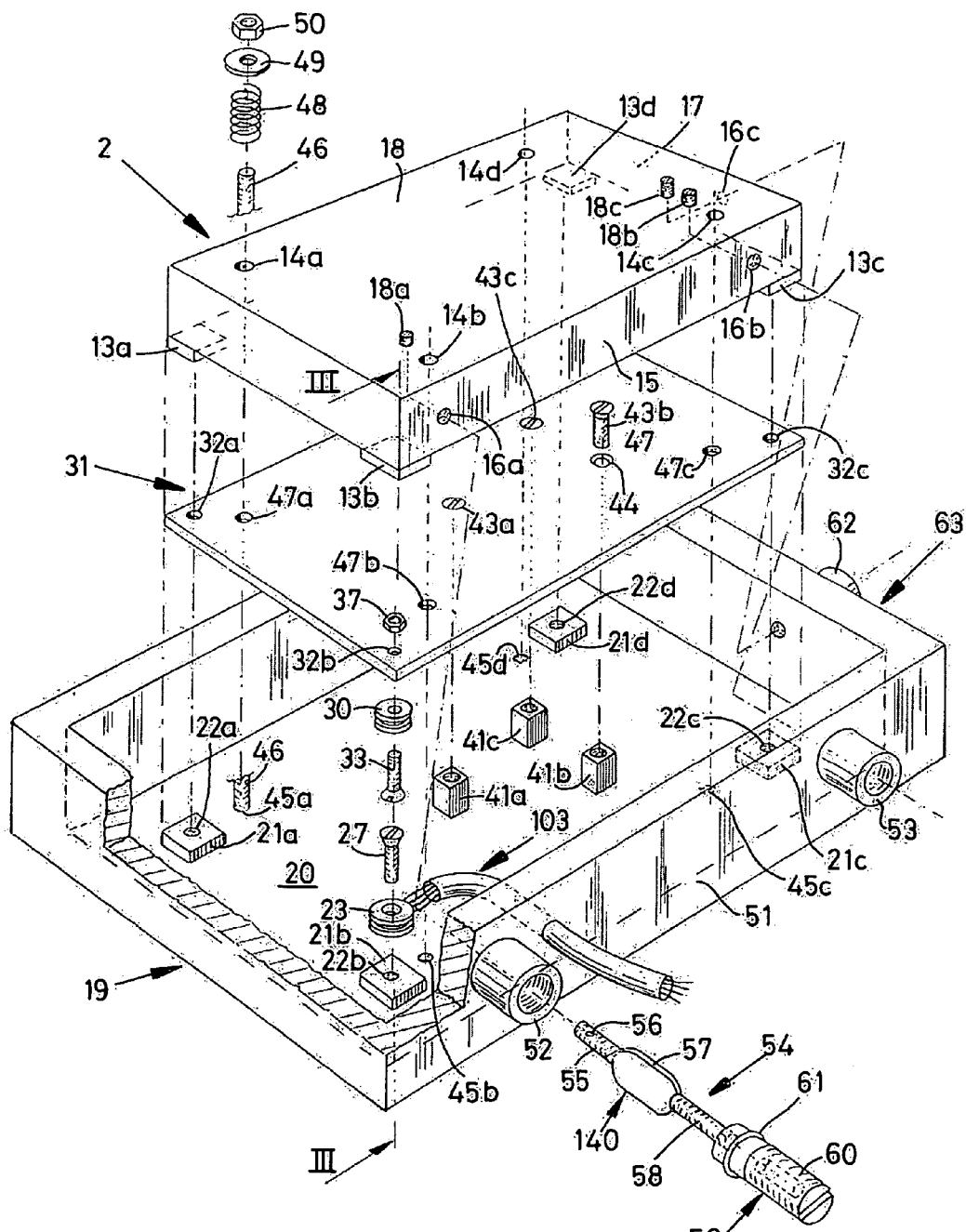
FIG. 2 shows, in exploded perspective view, the region around the connection between the manipulator and the electron microscope.
Figure 3:
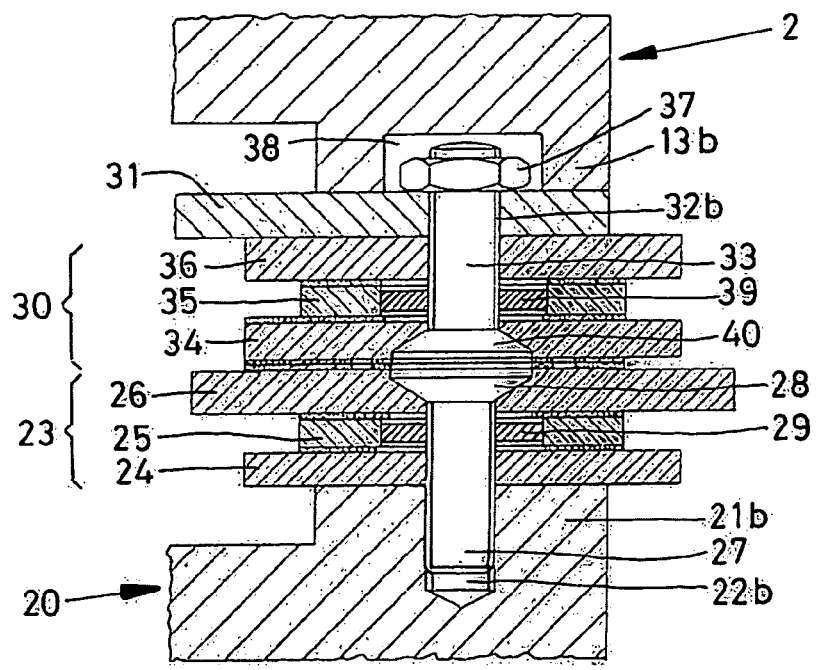
FIG. 3 shows cross section III—III in FIG. 2.

On the basis of FIG. 2, it will be further elucidated how, during manufacture of the scanning electron microscope, manipulator 1 is incorporated with the housing of the scanning electron microscope. In this context, it is noted that FIG. 2 is schematic in nature. FIG. 2 only depicts the base plate 2 of manipulator 1. This base plate 2 is provided at the corner points on its underside with square feet 13a, 13b, 13c, 13d. Near the corner points, bores 14a, 14b, 14c, 14d are present beside the feet 13a, 13b, 13c, 13d. Near the feet 13b and 13c, in the side face 15 of the base plate 2, two horizontally oriented screw-threaded shafts 16a, 16b have been created. In the rearmost side surface 17 (as depicted in FIG. 2) of base plate 2, a further horizontally oriented screw-threaded shaft 16c has been created close to foot 13c. Directly above the extremities of these screw-threaded shafts 16a, 16b, 16c, in the upper surface 18 of base plate 2, vertical screw-threaded shafts have been provided, which emerge into the screw-threaded shafts 16a, 16b, 16c and through which securing screws 18a, 18b, 18c extend for securing screw bodies that extend within the screw-threaded shafts 16a, 16b, 16c.

Of the housing of the scanning electron microscope, only a basin-like portion 19 is depicted in FIG. 2, which portion surrounds the side surfaces and underside of the base plate 2 in the assembled state. As an aside, it is noted that the housing of the scanning electron microscope does not have to be embodied as a single integral part, but that it can also be made up of a number of rigidly mutually connected components. In that context, it would be permissible, within the bounds of the invention, if the basin-like portion 19, or at least the base 20 thereof, were a part that was rigidly connected to the remaining portion of the housing. On the base 20, square raised portions 21a, 21b, 21c, 21d are provided, which are mutually positioned so as to correspond to feet 13a, 13b, 13c, 13d of base plate 2. Vertical screw-threaded shafts 22a, 22b, 22c, 22d are provided centrally in the square raised portions 21a, 21b, 21c, 21d.

On each of the four raised portions 21a, 21b, 21c, 21d is located a stack 23 of a lower printed circuit board disc 24, a disc-like piezo-electric actuator 25 and an upper printed circuit board disc 26. These disc-like bodies 24, 25, 25 are provided in their middles with a through hole, through which a vacuum-compatible screw 27 extends, whose head 28 is sunk into the upper printed circuit board disc 26. The screw 27 is turned inside the screw-threaded shaft associated with the relevant raised portion, as a result of which, to a limited extent, a clamping force exists between the lower printed circuit board disc 24, the piezo-electric actuator 25 and the upper printed circuit board disc 26. For the purpose of correctly centering the piezo-electric actuator 25, a further centering body 29 is provided in the central hole thereof.

In a more or less equivalent manner, a second stack 30 is furnished at each of the first stacks 23, against the undersurface of a coupling plate 31 that is present between the base plate 2 and the base 20. This coupling plate 31 is provided at its corner points with holes 32a, 32b, 32c (32d is not visible in FIG. 2). The second stack 30 consists of a lower printed circuit board disc 34, a piezo-electric sensor 35 and an upper printed circuit board disc 36. These disc-like bodies 34, 35, 36 are clamped against one another by means of a screw 33, which extends through central holes in these disc-like bodies as well as through the relevant hole 32a, 32b, 32c, 32d. Clamping occurs as a result of tightening nut 37 on the upper side of coupling plate 31. So as to accommodate the extremity of the screw thread of the screw 33, and that of nut 37, cavities 38 are provided on the underside of feet 13a, 13b, 13c, 13d. So as to allow correct centering of the piezo-electric sensor 35, a centering body 39 is provided in the hole of the piezo-electric sensor 35. The head 40 of screw 33 is sunk into the lower printed circuit board disc 34.

Around the middle of base 20, three raised portions 41a, 41b, 41c are provided. The height of these raised portions 41a, 41b, 41c is equal to the sum of the raised portions 21a, 21b, 21c, 21d, one stack 23 and one stack 30, so that the upper face of the raised portions 41a, 41b, 41c is substantially at the same vertical level as the upper surface of the four upper printed circuit board discs 36.

The function of the various printed circuit board discs and the piezo-electric sensors and actuators will be further elucidated later on. Assembly proceeds as follows. In the first instance, the stacks 23 are clamped to the raised portions 21a, 21b, 21c, 21d by tightening the screws 27 in the associated screw-threaded shafts 22a, 22b, 22c, 22d. The tightening force applied hereby in the case of the screws 27 principally serves to correctly and permanently position the various parts of the stack 23 with respect to one another. Stacks 30 are clamped against the undersurface of the coupling plate 31 by application of screw/nut combinations 33, 37. Subsequently, coupling plate 31 is screwed onto the upper faces of raised portions 41a, 41b, 41c by tightening screws 43a, 43b, 43c in screw-threaded shafts 42a, 42b, 42c in the upper faces of raised portions 41a, 41b, 41c. To this end, three holes 44 are provided around the center of coupling plate 31, which are mutually positioned so as to correspond to the raised portions 41a, 41b, 41c.

In a subsequent phase of the assembly process, manipulator 1 is placed on coupling plate 31, whereby the nuts 37 and the extremities of screws 33 extend—with a certain amount of sideways play—within the cavities 38 of the various feet 13a, 13b, 13c, 13d. For the purpose of ensuring that base plate 2 is not supported on only three feet 22a, 22b, 22c, 22d but, instead, on all four feet—as a result of which a desired statically over-determined support situation is achieved at four points of the base plate 2 on the base 20—one of the feet 13a, 13b, 13c, 13d is adjustable in height, in a manner not further depicted, whereby adjustment in height occurs, if necessary, after the base plate 2 has been placed on the coupling plate 31. In this manner, the base plate 2 of the manipulator 1 is positioned in such a manner that bores 14a, 14b, 14c, 14d extend more or less directly above holes 47a, 47b, 47c (47d is not visible) in coupling plate 31 and above screw-threaded shafts 45a, 45b, 45c, 45d in base 20. Thanks to this aligned positioning, it is possible for screw-threaded bodies 46—with a radial play of the order of approximately 1 to 2 mm—to extend through mutually associated bores 14a, 14b, 14c, 14d, holes 47a, 47b, 47c, 47d and screw-threaded shafts 45a, 45b, 45c, 45d. The undermost extremities of the screw-threaded bodies 46 are hereby screwed tight into the screw-threaded shafts 45a, 45b, 45c, 45d. Around the upper extremity of each screw-threaded body 46, a pressing spring 48 and a washer 49 are fitted. Subsequently, a nut 50 is tightened onto the upper extremity of the screw-threaded body 46, so that pressing spring 48 is pre-loaded and the four pressing springs 48 together press the base plate 2 downward with a force of the order of circa 600 N, supplemental to the gravitational force that is already exercised downwards as a result of the weight of the manipulator 1. As described earlier, the stiffness of the pressing spring 48 must not be too large, so as to avoid an undesired parallel stiffness across the stacks 23 and 30. A rule of thumb for determining an acceptable stiffness of the pressing spring 48 has already been given, whereby it should be noted that a typical eigenfrequency of the resonance (that is to be suppressed) of the manipulator 1 lies in the range between 75 and 1000 Hz. In this manner, one also achieves a situation whereby the stacks 23 and 30—or, more specifically, the upper face of the upper printed circuit board disc 26 and the lower face of the lower printed circuit board disc 34—are pressed against one another in good electrical contact. In this context, one should realize that the bending stiffness of coupling plate 31 is relatively small, as a result of the limited thickness thereof (circa 1 mm) and also the mechanical properties of the aluminum from which the coupling plate 31 is manufactured. Coupling plate 31 can, therefore, categorically not be considered as being stiff in the direction perpendicular to the plate plane of the coupling plate 31, and shall therefore not introduce any worrying parallel stiffness. As a result of its plate-like form, the coupling plate 31 is, however, stiff in the directions parallel to the plate plane of the coupling plate 31, which is of importance in bearing the sideways forces that arise as a result of displacing the base plate 2 over the coupling plate 31 in the horizontal direction, as will be further described hereunder.

The size of the downward force produced by the pressing springs 48 and the gravitational force associated with manipulator 1 is not so large as to render no longer possible a small horizontal displacement of the manipulator 1—or, more specifically, the base plate 2 thereof—by exercising a sideways force. Such a displacement is necessary in order to ensure that the manipulator 1—or, more specifically, the central axis of the arch-like guide ribs 10a and 10b, about which the swivel body 7 can swivel—is correctly positioned with respect to the electron beam that is generated in the case of the scanning electron microscope. So as to be able to correctly perform this positioning, it is necessary that manipulator 1 be brought into a vacuum environment, as a result of which it is possible to generate an electron beam, whereby this electron beam is subsequently employed in observing what the exact position and orientation of the manipulator 1 are.

For the purpose of displacing the manipulator 1 in three degrees of freedom while it is located within the housing of the scanning electron microscope, in vacuum, two screw-thread casings 52, 53 are provided in side face 51, through which casings an adjusting organ 54 extends. The adjusting organ comprises an engagement portion 140 at whose extremity is located a screw-thread portion 55 intended to engage in screw-threaded shafts 16a, 16b. Located in this screw-thread portion 55 is a securing hole 56 in which the respective extremities of securing screws 18a, 18b, 18c can engage, so as to secure the adjusting organ 54 in a prescribed rotational position. Located directly behind screw-thread portion 55 is a flat bending part 57, which ensures that the bending stiffness of the adjusting organ 54 is limited, at least in the direction parallel to the base 20. This flat part 57 is located between the aforementioned screw-thread portion 55 and a further screw-thread portion 58 of the engagement portion 140 that extends within an adjustment bushing 59 of the adjusting organ 54, which is provided around its central axis with an internal screw thread that co-operates with the further screw-thread portion 58. Adjusting bushing 59 is provided at one extremity with a screw thread 60 on its outside and at the other extremity with a sealing ring 61. Sealing ring 61 ensures that, despite the penetration of adjusting organ 54 through side face 51, the vacuum existing within the housing does not get interrupted. Screw thread 60 is destined for engagement co-operation with the internal screw threads of screw-thread casings 52, 53. The speed of screw thread 60, and therefore of the screw thread of the screw-thread casings 52, 53, is chosen so as to be greater than the speed of the further screw-thread portion 58 and the internal screw thread (not further depicted) in adjustment bushing 59. In this manner, a certain transfer ratio is realized, as a result of which turning the adjustment bushing 59 in the screw-thread casings 52, 53 leads to a very small longitudinal displacement of the screw-thread portion 55, and thus of the base plate 2 and the manipulator 1. A similar manner in which to adjust base plate 2 is also available at the location of screw-thread casing 62, which is provided on the outside of side face 63 in FIG. 2 at the rear side of the basin-like portion 19 of the housing, to which end screw-threaded shaft 16c is also provided. In this manner, it is possible to correctly position manipulator 1—in vacuum, in three degrees of freedom in the plane parallel to the base 20—with respect to the electron beam of the scanning electron microscope. As soon as the correct position is achieved, the three adjusting organs 54 are secured in a manner that is not further depicted, so that the position of the manipulator 1 within the housing of the scanning electron microscope is also fixed.

The various disc-like parts of stacks 23 and 30 are respectively depicted in FIGS. 4 to 9 and 10 to 15. Stack 30 comprises a piezo-electric sensor 35 in its middle. This sensor is able to measure forces. These forces result in a potential difference between the upper face 64 and the lower face 65 of the sensor 35, which is provided on its upper face 64 and lower face 65 with an evaporated silver layer for electrical contact purposes, so that upper face 64 and lower face 65 can accordingly be regarded as poles. The magnitude of this potential difference is a measure of the magnitude of the force or, with a more specific eye to vibrations of the manipulation unit 3, the temporal changes in force exerted on the sensor 35. For the purpose of measuring the potential difference, the upper printed circuit board disc 36 and the lower printed circuit board disc 34 are respectively provided at the upper face 64 and the lower face 65 of the sensor 35. The upper printed circuit board disc 36 is provided on its lower face with a ring-like conducting track 66 that lies against the upper face 64 of sensor 35. As is visible in FIG. 13, a protruding part 67 connects to the ring-like track 66, which part 67 extends to outside the perimeter of sensor 35. In the event of good conducting contact between the upper face 64 of sensor 35 and track 66 of the upper printed circuit board disc 36, the potential level at upper face 64 will correspond to the potential level at the location of contact point 68 on the protruding part 67.

The lower printed circuit board disc is also provided with a ring-like track 69, to which connects a protruding part 70 with contact point 71. In addition, on the outside of the upper face of the lower printed circuit board disc 34, a small track region 72 is provided, which is isolated from track 69 and which extends outside the external diameter of sensor 35. The contact point 73 is connected via an electrically conducting wire 74 to contact point 68 of the upper printed circuit board disc 36, so that contact point 73 will ultimately assume the same potential level as that of upper face 64 of sensor 35. Because of the fact that ring-like track 69 lies against the lower face 65 of sensor 35, contact point 71 will assume the same potential value as that of the lower face 65 of sensor 35. The lower face of the lower printed circuit board disc 34 is provided with two conducting tracks that are isolated from one another. One of the tracks comprises a ring-like portion 75 to which connects a protruding part 76 with contact point 77. The other track comprises an interrupted ring-like portion 78 that substantially surrounds ring-like portion 75, and is also provided with a protruding part 79 with a contact point 80. The contact points 71 and 80 are connected to each other right across the main body of the lower printed circuit board disc 34 via a conducting connection 81 (FIG. 12). A similar sort of connection is realized between the contact points 73 and 77. All of this results in a situation whereby the potential level of contact point 80 corresponds to that of the lower face 65 of sensor 35, while the potential level of contact point 77 corresponds to that of the upper face 64 of sensor 35, so that the potential difference between contact points 77 and 80 is a measure of the force that is exerted on the sensor.

A piezo-electric actuator 25 is centrally provided in stack 23. Such an actuator is able to expand and/or contract in the height direction in reaction to the application of a potential difference between the upper face 82 and the lower face 83 of actuator 25, which faces 82, 83 can be regarded as poles. In combination with a piezo-electric sensor, such as sensor 35, which is connected in series with actuator 83, it is thus possible to realize an active damping system. In this scenario, the potential difference between upper face 64 and lower face 65 of piezo-electric sensor 35 (which potential difference is a measure of the force that is exerted on this sensor) is passed on to a control system that processes this potential difference as an input signal and produces an output signal for the actuator 83, which, in reaction hereto, shall alter its height. In this fashion, it is possible to very suitably damp vibrations that, for example, arise as a result of sound waves acting on the housing of the scanning electron microscope, which might tend to cause the manipulation unit 3 to vibrate, as a result of which the required positional accuracy and stability of a sample with respect to the electron beam would not be achieved to a sufficient extent.

For the purpose of applying a potential difference between the upper face 82 and the lower face 83 of actuator 25, an upper printed circuit board disc 26 and a lower printed circuit board disc 24 are provided on opposite sides. This lower printed circuit board disc 24 is provided on its upper face with a ring-like track 84 with protruding part 85 on which a contact point 86 is located. The upper printed circuit board disc 26 is provided on its lower face with a ring-like track 87 to which connects a protruding part 88 on which a contact point 89 is provided. In addition to this, a small track region 90, which is isolated from ring-like track 87, is located on the lower face of the upper printed circuit board disc 26. The track region 90 comprises a contact point 91. The track region 90 is located outside the outer perimeter of actuator 25.

The upper face of the upper printed circuit board disc 26 is provided with two track regions 92, 93 on which respective contact points 94, 95 are located. In addition to this, two mutually isolated tracks are provided, one of which comprises a ring-like track portion 96 to which connects a protruding part 97 with a contact point 98, and the other of which comprises an interrupted ring-like track portion 99 that substantially surrounds ring-like track portion 96 and is provided with a protruding part 100 with contact point 101. During use, the ring-like track 96 with the protruding part 97 lies against the ring-like track 75 and the protruding part 76, respectively, as a result of which contact point 98 assumes the same potential level as that of the lower face of sensor 35. In a similar fashion, the potential level of contact point 101 assumes the same value as that of the upper face 64 of sensor 35. Contact points 86 and 91 are connected to one another via electrically conducting wire 102. By means of a connection comparable to connection 81, contact point 91 is connected to contact point 94. In this manner, the potential level of contact point 94 is equal to that of the lower surface 83 of actuator 25. Contact points 89 and 95 are also connected to one another by means of a connection similar to connection 81, so that the potential level of contact point 95 corresponds to that of the upper face 82 of actuator 25. In this manner, all relevant potential levels of the actuator and the sensor are available on the upper face of the upper printed circuit board disc 26, which enables very simple installation and simple connection possibilities for the actuator 25 and the sensor 35 via electrically conducting wire. To this end, a four-core cable 103 is provided with cores 104, 105, 106, 107 and a vacuum-compatible cladding 108. Running—through a single cladding and in close proximity to one another—the two cores 104 and 105 according to the description pertaining to the sensor 35 and the two cores 106 and 107 according to the description pertaining to the actuator 25 incurs the attendant risk of a certain degree of electrical coupling between actuator and sensor. Similar to the aforementioned mechanical crosstalk, it is possible that activation of one actuator by applying a potential difference between cores 106 and 107 may cause a small potential difference to arise between cores 104 and 105, as a result of which an unintended force is observed on the sensor 35, which force is unintentionally directly related to the potential difference applied between the cores 106 and 107 and not, as intended, to a force to be observed by the sensor 65 due to accelerative forces of the vibrations (that are to be damped) in manipulation unit 3. To avoid this effect—which is referred to in technical terms as "electrical crosstalk"—to as great an extent as possible, the two cores 104 and 105 are together preferably fed through the cladding 108 within an electrical cladding (not further depicted) that, at one of the extremities of cladding 108, is electrically connected to a suitable electrical reference contact point for the whole electrical system—a so-called "electrical earth point". In the same manner, the two cores 106 and 107 are together preferably fed through the cladding 108 within a similar electrical cladding (not further depicted) that, in a similar fashion, is connected to a suitable electrical earth point.

As is visible in FIG. 2, cable 103 is fed through side wall 51 in a gastight manner. As an alternative, it is also possible to make use of a plug system for this purpose. Outside the housing of the scanning electron microscope, there is a control system (not further depicted) that is capable of processing an output signal from the sensor 35—in the form of a potential difference between cores 104 and 105—and producing an output signal for the actuator 25—in the form of a potential difference between the cores 106 and 107—for the purpose of actively mitigating vibration of the manipulation unit 3.

As an aside, it is noted that, in the description of the embodiment, the function of actuator allotted to the lower stack 23 and the function of sensor allotted to the upper stack 30 are not limiting. Both functions are, in principle, completely exchangeable, so that the function of sensor can also be allotted to the lower stack 23 and the function of actuator can also be allotted to the upper stack 30.

So as to achieve correct positioning of the individual parts of the stacks 23 and 30 with respect to one another, it is also possible to provide these parts with a non-round form, as a result of which it is easy to have these parts assume the correct angular orientation with respect to one another.

In principle, vibrations shall occur in two essentially mutually perpendicular principal directions perpendicular to the direction of the normal to the sample holder 9, as a result of the position and orientation of the guides applied in the case of the manipulation unit 3. It is possible to actively oppose these vibrations by only activating each of the four applied actuators 25 via a control unit in sole dependence upon the output signal that the sensor associated with the relevant actuator passes to the control unit. An important disadvantage of such a method of damping—in which, consistently, only one single combination of actuator 25 and sensor 35 co-operates with one control unit—is that a disadvantageous torsional deformation of the base plate 2 is unavoidable. Seeing as the four actuators 25 are provided at the corner points of the base plate 2, it is impossible in the case of independent operation of the four actuators 25 that the base plate 2 remain as a perfectly flat plate; instead, this shall be torsionally loaded, and accordingly deformed, as a result of which the accuracy with which the manipulator 1 can position a sample will also ultimately be disadvantageously influenced. Moreover, when one actuator 25 is activated, forces will now be observed on all four of the sensors 35, which forces are unintentionally related to the reaction forces occurring as a result of the torsional deformation of the base plate 2 and not, as intended, to the force to be observed by the sensors 35 as caused by accelerative forces of the vibrations (to be damped) of the manipulation unit 3. This behavior, which is caused by parallel stiffness across all four combinations of series-positioned actuator 25 and sensor 35, is also referred to using the technical term "crosstalk from actuator to sensor". In the case of an excessive degree of this (mechanical) crosstalk from actuator to sensor, the risk arises that, as far as control theory is concerned, it will become impossible to continue to effectively damp vibrations with the aid of Smart Discs.

A logical solution to this problem would seem to reside in the application of only three combinations of actuators 25 and sensors 35. Such a means of supporting the base plate 2 at three points is called "statically determined", while supporting at four (or more) points is essentially statically over-determined. As a consequence of supporting the base plate 2 at three points in a statically determined fashion, the independent activation of three actuators 25 logically cannot lead to (torsional) deformation of the base plate 2, seeing as the base plate in its flat state—without being torsionally loaded—can direct itself to the (very small) damping motions of the three actuators 25, as a result of which it will only become tilted to a (very small) extent.

Practically speaking, however, such a scenario of statically determined support of the base plate 2 at just three points has the considerable disadvantage that a torsional deformation of the base plate 2 is now, in fact, freely possible, and is only limited by the internal torsional stiffness of the base plate 2 itself, without being further impeded by the presence of a fourth support. The great risk here (i.e. the statically determined support of the base plate 2 at just three points) is that the torsional stiffness of this torsionally limp base plate 2 would now determine the first (i.e. the lowest) eigenfrequency—and the vibrational form associated therewith—of the manipulator as a whole, rather than, as desired, principally the manipulation unit 3, if support were to occur—via a parallel guide that, in practice, did not determine the eigenfrequency and via the base plate 2—at four points (i.e. in a statically over-determined manner). In addition, the first (i.e. lowest) eigenfrequency of the dynamic system demonstrating the perturbing vibrations will be much lower in value if the base plate 2 is supported at three points than if the base plate is supported at four points. In general, in an initial situation, i.e. before any control unit is rendered effective for any combination of sensor 35 and actuator 25, a lower first eigenfrequency of the dynamic system demonstrating the perturbing vibrations will lead to markedly greater amplitudes of the vibrations as a result of excitation via acoustic environmental noise or floor vibrations. Consequently, the final amplitude of the vibrations subsequent to optimal damping of the vibrations—after one or more control units are made effective—will always be smaller if the value of the first eigenfrequency of the dynamic system demonstrating the perturbing vibrations is as high as possible to start off with. Accordingly, the described statically over-determined method of supporting the base plate 2 at four points is highly preferential. In order to achieve this desired statically over-determined method of support during assembly, it is accordingly necessary—as already described above—that one of the feet 13*a*, 13*b*, 13*c* or 13*d* be adjustable in height in a manner not further elucidated.

In the present preferential embodiment of the invention, the disadvantage of mechanical crosstalk from actuator to sensor as described above, which is the unavoidable consequence of the highly desired over-determined support at four points, is overcome in the case of using four combinations of actuators 25 and sensors 35 by arranging that each, or at least a portion, of the four actuators 25 not be rendered active in dependence upon only the output signal emitted and passed to the control unit by the sensor 35 associated with the actuator 25 concerned, but rather in dependence upon the (sum of) the output signals of at least two sensors. In this manner, the possibility arises of matching the activation of the sensors 25 to one another, so that, despite the fact that there are four support points for the base plate 2, the base plate 2 will not be torsionally loaded and, accordingly, will not deform.

Figure 16:
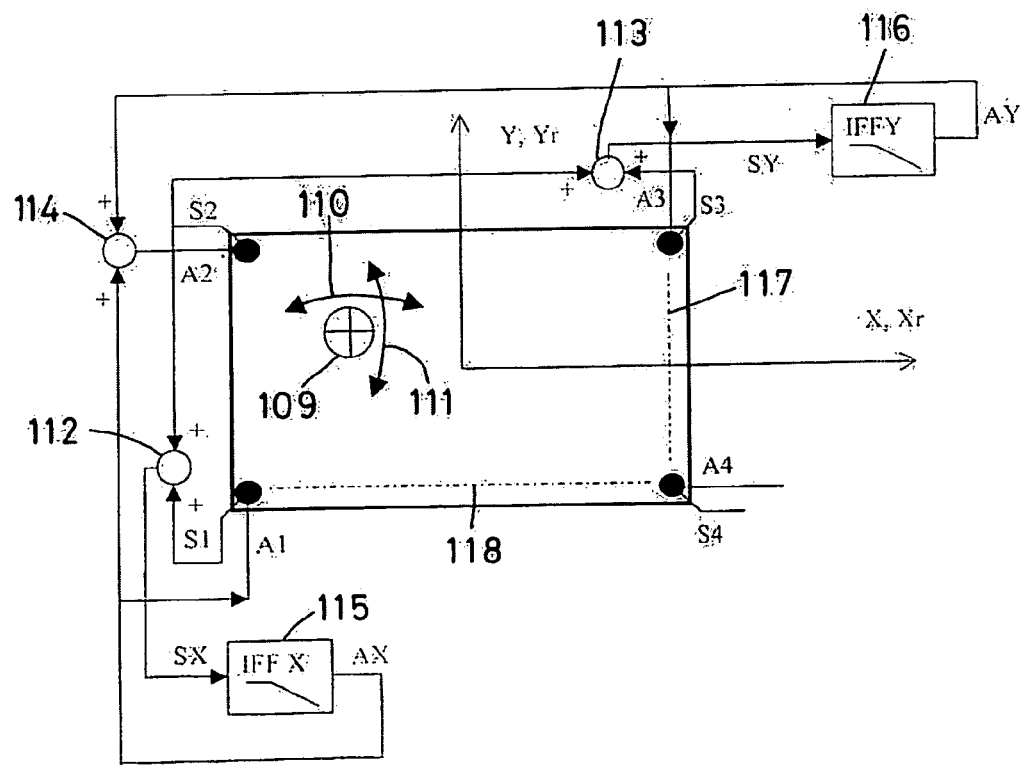
FIG. 16 shows a control theory scheme for damping vibrations of a manipulator.

Various aspects of the above will be elucidated on the basis of FIG. 16. FIG. 16 renders a highly schematic plan view of base plate 2. Black dots indicate the four combinations of actuators 25 and sensors 35 at the corner points. In addition, FIG. 16 indicates the rough location of the center of gravity 109 of the manipulation unit 3, around which two curved arrows 110, 111 symbolize the two mutually perpendicular principal directions of vibration. The output signals of the sensors 35—which, as already mentioned, are a measure of the force registered by the sensors 35—are respectively indicated by S1, S2, S3 and S4. The input signals to the respective actuators 25 are indicated by A1, A2, A3 and A4. The associated control system comprises three combination units 112, 113, 114, each of which generates a single output signal by adding together two incoming signals. In addition, the control system comprises two control units 115, 116, which process incoming signals according to a given frequency-dependent characteristic (referred to as "controller transfer") and amplification factor (referred to as "gain") so as to produce output signals. In practice, such control units can be embodied as an analog electronic circuit, or as a digital computer.

The output signals S1 and S2 are added by combination unit 112, resulting in an output signal SX that functions as an input signal for control unit 115. In a similar manner, the output signals S2 and S3 are added by combination unit 113, resulting in an output signal SY that functions as an input signal for control unit 116. The input signals SX and SY are processed by the respective control units 115, 116 to produce respective output signals AX and AY. These signals AX and AY are employed as input signals A1 and A3 for the actuators 25 respectively associated with the first combination and the third combination of an actuator 25 and a sensor 35. The signals AX and AY are further added by combination unit 114, resulting in an input signal A2 for the actuator 25 of the second combination. In this manner, each input signal A1, A2, A3 for an actuator 25 is dependent on the force that is measured by the associated sensor 35 as well as that measured by a neighboring sensor 35. It is of importance to note that the actuator 25 and sensor 35 of the fourth combination as a whole remain unused. In the present preferential embodiment, this fourth combination could accordingly be replaced by a passive mechanical support point. The force that is measured by the sensor 35 of the second combination, which is located opposite the fourth combination, is, in contrast, employed so as to influence the activity of the actuators 25 of the first, second and third combination. In addition to this, the activity of the sensor 25 of the second combination is dependent upon the forces that are measured by all three sensors 35 of the first, second and third combination.

Combining the various signals as described above on the basis of FIG. 16 results in a situation whereby vibrations according to arrow 110 are damped as a result of the action of the actuators 25 of the first and second combination, whereby the base plate 2 swivels about a swivel axis 117 that extends through the support points of base plate 2 at the location of the third and fourth combination. Vibrations according to arrow 111 will be damped as a result of the action of the actuators 25 of the second and third combination, whereby the base plate 2 swivels about a swivel axis 118 that extends through support points of base plate 2 at the location of the first and fourth combination. Due to these swivel axes 117, 118, the base plate 2 will not be torsionally loaded, so that the various sensors 35 will not register any perturbing forces resulting herefrom. The base plate 2 will accordingly remain flat.

Figure 17:
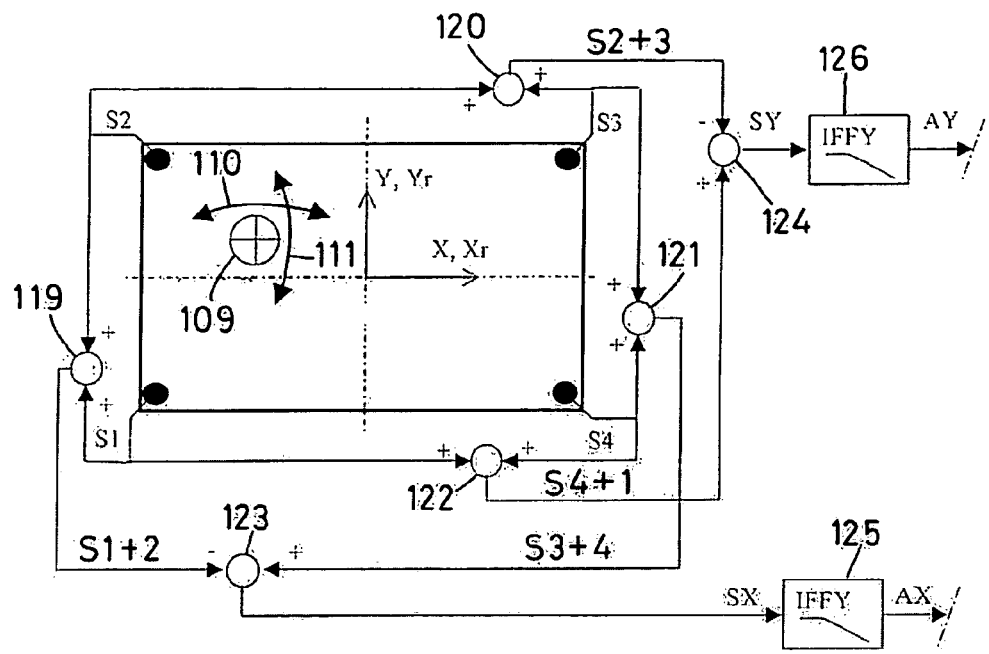
FIG. 17 shows an alternative control theory scheme as regards the sensors.
Figure 18:
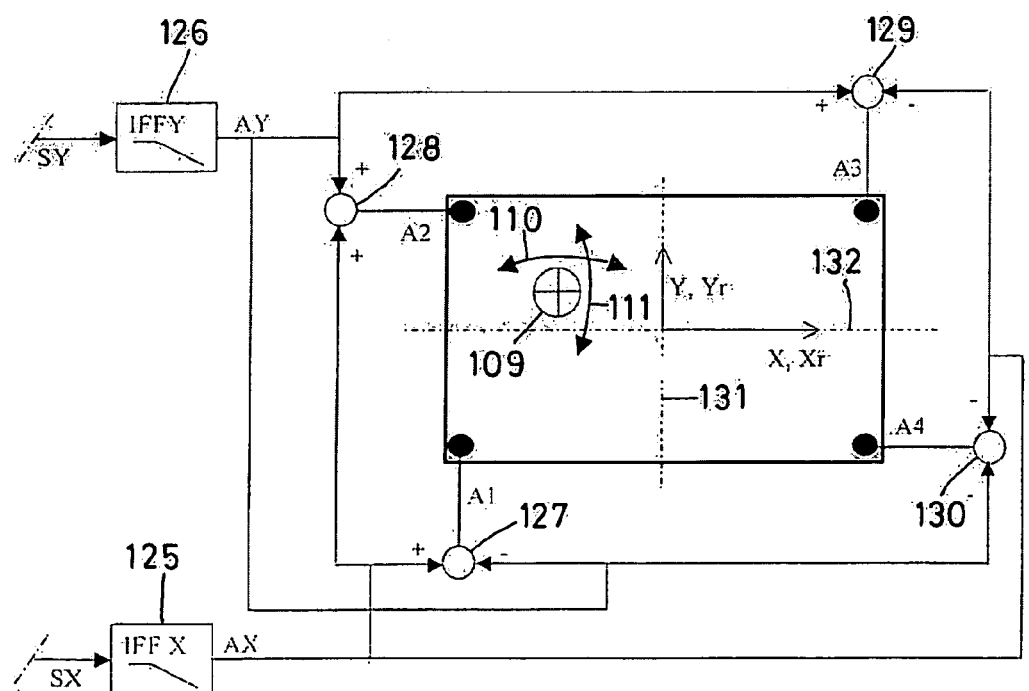
FIG. 18 shows the associated alternative control theory scheme for the actuators.

An alternative control system that can be advantageous with an eye to symmetry, and that allows a higher sensitivity of the applied actuators and sensors to be achieved, leading to a more favorable signal-to-noise ratio, is schematically depicted in FIGS. 17, 18. In this control system, the fourth combination of an actuator 25 and sensor 35 is actually applied. As can be derived from FIG. 17:

combination unit 119 generates signal S1+2 on the basis of output signals S1 and S2;

combination unit 120 generates signal S2+3 on the basis of output signals S2 and S3;

combination unit 121 generates signal S3+4 on the basis of output signals S3 and S4, and combination unit 122 generates signal S4+1 on the basis of output signals S4 and S1.

On the basis of (the difference between) signals S1+2 and S3+4, combination unit 123 generates signal SX, whereas, on the basis of (the difference between) signals S2+3 and S4+1, combination unit 124 generates signal SY. The signals SX and SY are processed by respective control units 125, 126 to produce signals AX and AY (FIG. 18). On the basis of (the difference between) the signals AX and AY, combination unit 127 generates control signal A1 for the actuator 25 of the first combination. On the basis of (the sum of) the signals AX and AY, combination unit 128 generates control signal A2 for the actuator 25 of the second combination. On the basis of (the difference between) the signals AY and AX, combination unit 129 generates control signal A3 for the actuator 25 of the third combination. Finally, on the basis of (the negative sum of) the signals AX and AY, combination unit 130 generates control signal A4 for the actuator 25 of the fourth combination.

In the case of a control system operating in this manner, each control signal A1, A2, A3, A4 is dependent upon the forces that are measured by each sensor 35 of the four combinations. Vibrations according to arrow 110 are damped by the activity of all four actuators 25, whereby, on the one hand, the actuators 25 of the first and second combination, and, on the other hand, the actuators 25 of the third and fourth combination, will act in pairs in an inverted manner, as a result of which swiveling of the base plate 2 about the swivel axis 131 will occur. In a similar manner, vibrations according to arrow 111 are damped by the activity of all four actuators 25, whereby, on the one hand, the actuators 25 of the first and fourth combination, and, on the other hand, the actuators 25 of the second and third combination, will act in pairs in an inverted manner, as a result of which swiveling of the base plate 2 about the swivel axis 132 will occur. Swivel axes 131 and 132 correspond to the middle lines of base plate 2. Swiveling action of base plate 2 about these swivel axes 131, 132 will not result in plate 2 being torsionally loaded and disturbingly deformed.

It will be clear to the expert reader that control systems in all sorts of different forms can be applied within the bounds of the invention. For example, it is possible to displace the location of the swivel axes of the manipulation unit 3—possibly in dependence upon their momentary position with respect to the degrees of freedom—by assigning different weights to the input signals in the case of the employed combination units. In this manner, one can, for example, manipulate the point of intersection of the swivel axes so as to be roughly directly underneath the center of gravity 109 of the manipulation unit 3 in every position of the sample holder 9. A rotation of the swivel axes can even be achieved in this manner. In the case of such a strategy, the exact form of the control system is thus actually made dependent upon one or more parameters of the whole system (for example, the position of the sample holder 9).

The invention claimed is:

1. A particle-optical device for irradiating an object with a beam of particles, comprising a housing in which are located positioning means for positioning the object within the housing, comprising a reference body supported against a supporting portion of the housing and a kinematic system holding the object and controllably move-able with respect to the reference body, for manipulating the object in at least one degree of freedom with respect to the reference body, and further comprising a control mechanism and at least one combination of a piezo-electric position actuator and a piezo-electric force sensor positioned in series, whereby the control means receives at least one input signal from at least one sensor and—generates a control signal for at least that actuator associated with the sensor, characterized in that the at least one combination is positioned between the housing and the reference body, the support of the reference body against the supporting portion of the housing occurring via said at least one combination wherein each actuator is clamped between, respectively, a first printed circuit body, in conducting contact with a first actuator pole of the actuator, and a second printed circuit body, in conducting contact with a second actuator pole of the actuator, which first printed circuit body and which second printed circuit body are in conducting contact with the control mechanism.

2. A device according to claim 1, wherein the control mechanism comprises a first combining mechanism for the purpose of combining at least a first input signal and a second input signal—from, respectively, at least a first sensor and a second sensor—into a first combined input signal, in dependence upon which the control mechanism generates a first mutual control signal for the respective actuators associated with at least both the first sensor and the second sensor.

3. A device according to claim 2, wherein the control mechanism comprises second combining mechanism for the purpose of combining at least the second input signal and a third input signal, from at least the second sensor and a third sensor, respectively, into a second combined input signal, in dependence upon which the control mechanism generates a second mutual control signal for the respective actuators associated with at least the second sensor and the third sensor, whereby the control mechanism comprises a third combining mechanism for the purpose of combining the first mutual control signal and the second mutual control signal into a combined mutual control signal for the second actuator.

4. A device according to claim 1, wherein plate-like intermediate body is provided between the at least one combination, and the reference body, wherein the reference body can be displaced in a direction parallel to the plate-like intermediate body with the aid of an adjusting mechanism.

5. A device according to claim 4, wherein the adjusting mechansim is embodied so as to allow the reference body to be displaced in three degrees of freedom.

6. A device according to claim 4, wherein the reference body is supported against the intermediate body with a force that lies in the range between twice and twenty times the total weight of the positioning mechanisms that are to be supported.

7. A device according to claim 6, wherein a spring mechanism is provided for the purpose of forcing the reference body and the intermediate body toward one another.

8. A device according to claim 1, wherein each sensor is clamped between, respectively, a first printed circuit body, in conducting contact with a first sensor pole of the sensor, and a second printed circuit body, in conducting contact with a second sensor pole of the sensor, which first printed circuit body and which second printed circuit body are in conducting contact with the control mechansim.

9. A device according to claim 8, wherein printed circuit bodies that are located between the actuator and the sensor of a combination are provided, at the sides facing one another, with contact points that are conductively connected to each other.

10. A device according to claim 9, wherein at least a portion of the printed circuit bodies is provided—on at least one external surface—with at least one isolated conducting track for direct electrical contact either with a pole of an actuator or of a sensor or with a contact point or conducting track of a printed circuit body.

11. A device according to claim 1, wherein the actuator and associated printed circuit bodies are provided with mutually connecting holes that collectively form a through-hole through which a traction organ extends for the purpose of clamping the actuator between the associated printed circuit bodies.

12. A device according to claim 1, wherein one of the two printed circuit bodies associated with the actuator of a combination is provided with two contact points that are in conducting contact with both poles of the associated actuator.

13. A device according to claim 12, wherein one of four printed circuit bodies associated with the actuator and the sensor of a combination is provided with four contact points that are in conducting contact with both poles of both the actuator and the sensor.

14. A particle-optical device for irradiating an object with a beam, comprising:
 a housing with a supporting portion to support a reference body;
 a reference body supported by the supporting portion of the housing;
 a kinematic system supported by the reference body, the kinematic system adapted to hold and move the object in at least one degree of freedom with respect to the reference body;
 a plurality of sensor-actuator combinations, spaced apart and positioned between the housing supporting portion and the reference body, so that each sensor can sense vibration at a different point, and so that each actuator can react to reduce vibration of the reference body and kinematic system in response to control signals derived from signals from the sensors; and
 a controller to form control signals from combinations of signals received from a plurality of sensors, and to distribute control signals to each of a plurality of actuators of the combinations to make the actuators absorb vibrations of the reference body with respect to the housing wherein an actuator of a sensor-actuator combination comprises a stack of discs, comprising a piezoelectric actuator disc between and in contact with two printed circuit board discs to couple poles of the actuator to the controller, and further wherein a sensor of the sensor-actuator combination comprises a stack of discs, comprising a piezoelectric sensor disc between and in contact with two printed circuit board discs to couple poles of the sensor to the controller.

15. The device of claim 14, wherein a printed circuit board disc associated with a sensor is in conducting contact with a printed circuit board disc associated with an actuator.

16. The device of claim 14, wherein a first printed circuit board disc is in conducting contact with the second printed circuit board disc.

17. The device of claim 14, wherein a sensor of a sensor-actuator combination comprises a stack of discs, comprising a piezoelectric sensor disc between and in contact with two printed circuit board discs to couple poles of the sensor to the controller.

18. The device of claim 17, wherein a first printed circuit board disc is in conducting contact with the second printed circuit board disc.

19. The device of claim 14, wherein a control signal for an actuator of a first sensor-actuator combination is derived from a signal from the sensor of the first combination and from signal of a sensor of a second sensor-actuator combination.

20. The device of claim 19, wherein the control signal for the actuator of the first combination is further derived from a signal from a sensor of a third sensor-actuator combination.

21. The device of claim 20, wherein the control signal for the actuator of the first combination is further derived from a signal from a sensor of a fourth sensor-actuator combination.

22. The device of claim 14, wherein a control signal for an actuator is derived from a sum of the signals from each of two sensors.

23. The device of claim 14, wherein a control signal for an actuator is derived from the signals from each of three sensors to stabilize the reference body without substantial torsion.

24. The device of claim 14, wherein at least three sensor-actuator combinations are positioned at rectangular coordinates to generate X and Y control signals derived from the sensor signals to compensate for pivot of the reference body with respect to the housing about an X axis and/or a Y axis.

25. The device of claim 14, further comprising a plate-like intermediate body between the sensor-actuator combinations and the reference body, with adjusting means to laterally position the reference body with respect to the intermediate body.

26. The device of claim 25, wherein the reference body is supported against the intermediate body with a force that lies in the range between twice and twenty times the total weight of the reference body and kinematic system that are to be supported.

* * * * *